(12) United States Patent
Radhakrishna et al.

(10) Patent No.: US 12,183,672 B2
(45) Date of Patent: Dec. 31, 2024

(54) FAIL-OPEN ISOLATOR

(71) Applicant: TEXAS INSTRUMENTS INCORPORATED, Dallas, TX (US)

(72) Inventors: Ujwal Radhakrishna, San Jose, CA (US); Vinod Rai, San Jose, CA (US); Yogesh Ramadass, San Jose, CA (US); Anant Kamath, Bengaluru (IN); Kashyap Barot, Bengaluru (IN)

(73) Assignee: Texas Instruments Incorporated, Dallas, TX (US)

( * ) Notice: Subject to any disclaimer, the term of this patent is extended or adjusted under 35 U.S.C. 154(b) by 115 days.

(21) Appl. No.: 17/677,729

(22) Filed: Feb. 22, 2022

(65) Prior Publication Data
US 2023/0268270 A1  Aug. 24, 2023

(51) Int. Cl.
*H01L 23/525* (2006.01)
*H02H 3/04* (2006.01)

(52) U.S. Cl.
CPC ......... *H01L 23/5256* (2013.01); *H02H 3/046* (2013.01)

(58) Field of Classification Search
None
See application file for complete search history.

(56) References Cited

U.S. PATENT DOCUMENTS

2007/0152732 A1\* 7/2007 Solano ................... G11C 29/56
  327/525
2021/0066909 A1 3/2021 Ramadass et al.

OTHER PUBLICATIONS

Components 101, "Different Types of Fuses and their Applications," Jun. 2, 2020, last retrieved Aug. 18, 2020, available online: https://components101.com/articles/different-types-of-fuses-and-their-applications (20 pages).
Wikepedia, "Fuse (electrical)," Aug. 17, 2020, last retrieved Aug. 18, 2020, available online: https://en.wikipedia.org/w/index.php?title=Fuse_(electrical)&oldid=973491970 (15 pages).
Fuses Unlimited, "Semiconductor Fuse," last retrieved Aug. 18, 2020, available online: https://www.fusesunlimited.com/products/semiconductorfuse (2 pages).

(Continued)

*Primary Examiner* — Cassandra F Cox
(74) *Attorney, Agent, or Firm* — Valerie M. Davis; Frank D. Cimino (57) ABSTRACT

A device includes first and second device terminals, a fuse, a first circuit, a first transistor, and a control circuit. The fuse terminal couples to the first device terminal. The first circuit couples to the second fuse terminal. The second fuse terminal has a first voltage. The first transistor has a first control input and first and second current terminals. The first current terminal couples to the second fuse terminal, and the second current terminal couples to the second device terminal. The control circuit: turns "on" the first transistor into a saturation region if the first voltage exceeds a threshold and a current through the fuse exceeds a trip threshold current of the fuse; and turns "on" the first transistor into a linear region if the first voltage exceeds a threshold and a current through the fuse is below the trip threshold current of the fuse.

18 Claims, 6 Drawing Sheets

(56) References Cited

OTHER PUBLICATIONS

Semtech, "SI96-01 Surging Ideas TVS Diode Application Note," Sep. 2000 (1 page).
Rakesh Panguloori, Texas Instruments, "Basics of eFuses: Application Report," Dec. 2016—Revised Apr. 2018 (14 pages).
Texas Instruments, "TPS2660x 60-V, 2-A Industrial eFuse With Integrated Reverse Input Polarity Protection," Jul. 2016—Revised Dec. 2019 (54 pages).
"TPS2663x 60-V, 6-A Power Limiting, Surge Protection Industrial eFuse", Texas Instruments product data sheet SLVSE94E, Sep. 2018, revised Mar. 2020, (59 pages).

* cited by examiner

FAIL-OPEN ISOLATOR

CROSS-REFERENCE TO RELATED APPLICATIONS

This application may contain subject matter that is related to U.S. application Ser. No. 17/011,522, filed Sep. 3, 2020, titled "Methods and Apparatus to Improve Performance of Power Path Protection Devices", and U.S. application Ser. No. 17/490,157, filed Sep. 30, 2021, titled "Active Metal Fuses For DC-EOS and Surge Protection".

BACKGROUND

An isolator is a device that electrically isolates one circuit from another. The two circuits being isolated may operate in different voltage domains and may have different "ground" potentials. The isolator bridges together two different voltage domain circuits and provides an isolation bridge therebetween. The isolation bridge may include an opto-coupler, a capacitive bridge, an isolation transformer, galvanic isolation, etc. In general, the isolation bridge permits data to be transferred from one circuit (e.g., a, transmitter) to other circuit (e.g., a receiver) while allowing the circuits to operate in different voltage domains.

SUMMARY

In at least one example, a device includes first and second device terminals, a fuse, a first circuit, a first transistor, and a control circuit. In one embodiment, the fuse is a self-heating, serpentine fuse having a first and second fuse terminals. The first fuse terminal is coupled to the first device terminal. The first circuit is coupled to the second fuse terminal. The second fuse terminal is configured to have a first voltage. The first transistor has a first control input and first and second current terminals. The first current terminal is coupled to the second fuse terminal, and the second current terminal is coupled to the second device terminal. The control circuit is configured to: turn "on" the first transistor into a saturation region in response to the first voltage exceeding a threshold and a current through the fuse exceeding a trip threshold current of the fuse; and to turn "on" the first transistor into a linear region in response to the first voltage exceeding a threshold and a current through the fuse being below the trip threshold current of the fuse.

BRIEF DESCRIPTION OF THE DRAWINGS

For a detailed description of various examples, reference will now be made to the accompanying drawings in which.

The same reference numbers or other reference designators are used in the drawings to designate the same or similar (either by function and/or structure) features.

DETAILED DESCRIPTION

The examples described herein are directed to safety circuits that detect an electrical overstress (EOS) event and prevent the EOS from damaging the system in which the safety circuits are included. An EOS event may be characterized by an over-voltage and/or over-current condition, in which the excessive voltage or current may cause damage to electrical circuit components. The safety circuits described may be included as part of a wide variety of systems. In the specific examples described herein, the safety circuits are included as part of an integrated circuit (IC) having an isolation barrier between portions of the IC operating in different voltage domains. However, the safety circuits described herein can be applied to numerous other types of ICs.

An isolator includes an isolation bridge disposed between and isolating two "sides" of the isolator. Each side of the isolator can be connected to a respective external circuit. The bridge provides isolation between the two sides of the isolator and thus between the two external circuits. The first and second sides of the isolator may operated in different (or the same) voltage domains.

A desirable function of an isolator is to prevent an EOS on one side of the isolator from damaging the isolator and from damaging any circuits connected to the other side of the isolator. In one example of an EOS event, a current and/or voltage within an external circuit connected to one side of the isolator exceeds a safe operating level of the respective circuit and the isolator. The isolator described herein includes one or more self-heating, meandering fuses that blow open (e.g., melts, vaporizes, etc.), thereby rendering the fuse to be non-conductive, at a lower current level than other types of fuses. The isolator also includes circuitry that clamps an input voltage that exceeds a threshold and, if the current into the isolator is large enough to blow the fuse on that side of the isolator, the circuitry provides a low impedance current path to permit a sufficiently high current to blow the corresponding self-heating, meandering fuse while also protecting other circuitry in the isolator. If the current into the isolator is not large enough to blow the fuse (despite the input voltage exceeding a safe operating threshold), the isolator's circuitry introduces a resistance into the current path to maintain the current at a safe level while periodically checking to determine if the input voltage still remains above the safe operating threshold.

Figure 1:
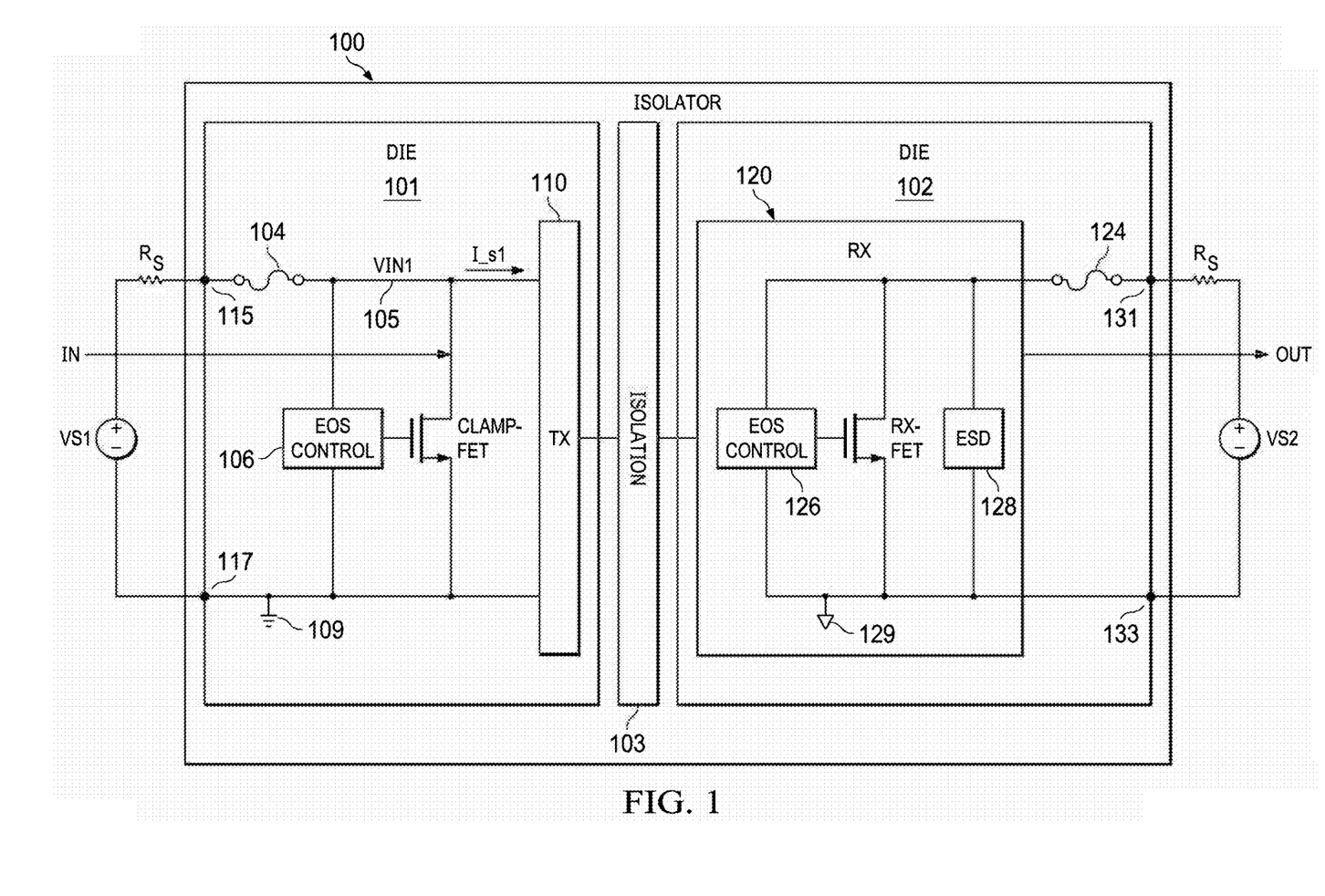
FIG. 1 is a schematic of an isolator including two semiconductor dies separate by an isolation bridge in accordance with an example.

FIG. 1 is a schematic diagram of an isolator 100 in accordance with an example implementation. The isolator 100 includes semiconductor dies 101 and 102 packaged together as one isolator device (isolator 100), although the isolator can be implemented in other examples with a single die. Each die represents one "side" of the isolator 100. The dies 101 and 102 may, individually or collectively, be attached to lead frames and encapsulated in a mold compound to form the device. The dies 101 and 102 are separated by an isolation barrier 103. The isolation barrier may be implemented as a transformer, an opto-coupler, capacitors, or another type of barrier that permits signals to be transmitted from one die to the other die while isolating dies 101 and 102 with respect to the supply/ground voltages. Each die has a respective ground-ground 109 for die 101 and die 129 for die 102. The symbol for ground 109 differs from that of ground 129 to indicate that the dies have separate (unconnected) grounds. Die 101 receives a supply voltage VS1 at terminal 115, and die 102 receives a supply voltage VS2 at a terminal 131. The two supply voltages VS1 and VS2 are isolated from each other and they do not share the same ground. In one embodiment, the magnitude of VS1 relative to ground 109 is different from the magnitude of VS2 relative to ground 129. In another embodiment, the magnitude of VS1 relative to ground 109 is the same as the magnitude of VS2 relative to ground 129. Terminal 117 of die 101 is coupled to ground 109, and terminal 133 of die 102 is coupled to ground 129. In an alternative example, circuitry 101, circuitry 102 and isolation 103 are fabricated in/on a single semiconductor substrate.

Figure 7:
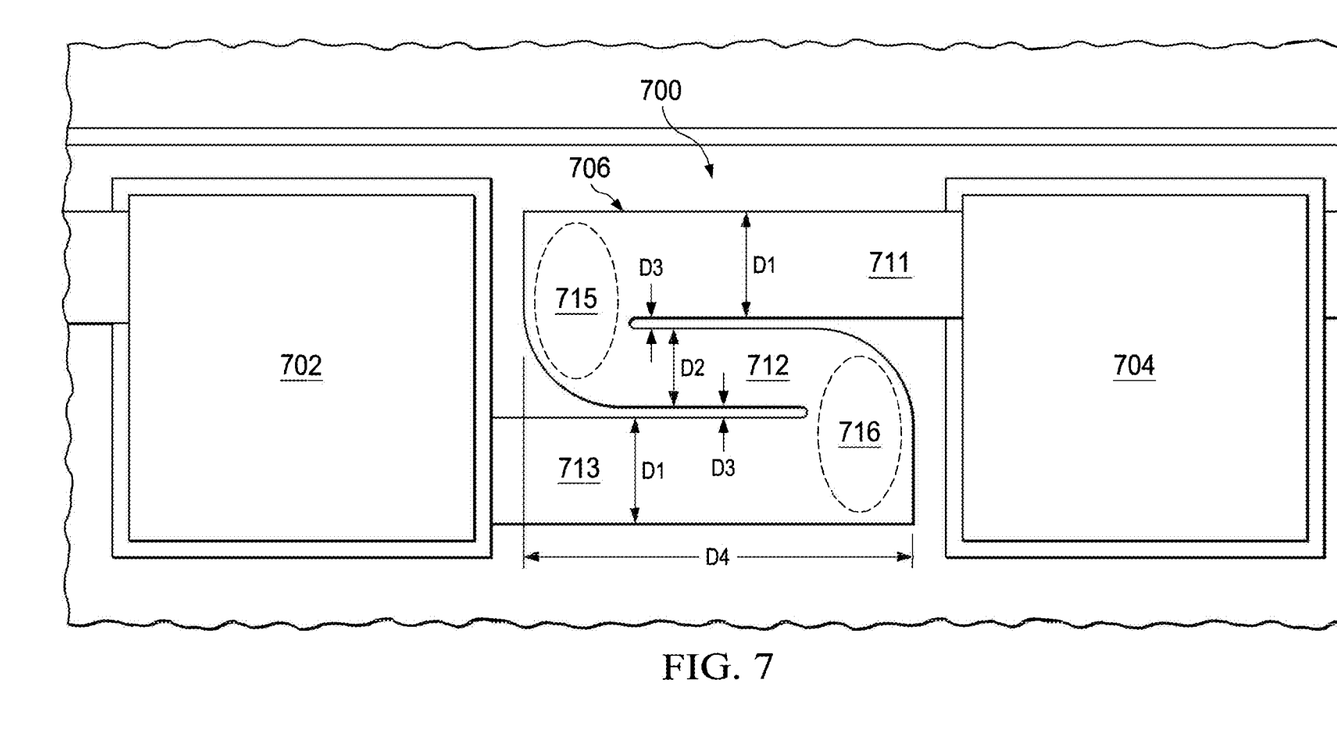
FIG. 7 is a top-down view of self-heating, meandering fuse for use in the isolator of FIG. 1 in accordance with an example.

In this example, die 101 includes a transmitter (TX) 110 and die 102 includes a receiver (RX) 120. In alternative embodiments, die 101 may include a receiver and/or a transmitter and circuitry 102 may include a transmitter and/or a receiver. An input signal (IN) can be provided to TX 110 of die 101, transmitted by the TX 110 through the isolation barrier 103 to the RX 120 on die 102, and then output by RX 120 as an output signal (OUT). A meandering, self-heating fuse 104 is provided in the path of current from the external voltage source VS1 and the TX 110. FIG. 7 (described below) shows an example implementation of the self-heating, meandering fuse 104. Conductor 105 (e.g., a conductive trace in one or more metal structures over a semiconductor substrate/die) couples the fuse 104 to the TX 110. The voltage on conductor 105 is designated as VIN1. VIN1 may be slightly lower than VS1 due to a voltage drop across series resistance Rs. Series resistance Rs models, for example, the resistance of traces and interconnects between VS1 and die 101. The source current through Rs and the fuse 104 is I_s1.

Die 101 includes a transistor labeled "Clamp-FET." In some examples, this transistor is a metal oxide semiconductor field effect transistor (MOSFET) that is normally open ("off/non-conducting) and is turned "on" (conducting) by an EOS control circuit 106 in response to the voltage on conductor 105 exceeding a safe operating level. In other embodiments, the transistor can be other than a MOSFET, such as a bipolar junction transistor (BJT). In the example of FIG. 1, the clamp-FET is an N-type MOSFET device (NFET). EOS control circuit 106 turns the clamp-FET "on" and off in response to the voltage VIN1 on conductor 105, as explained in detail below. The EOS control circuit 106 turns "on" the clamp-FET into the saturation region in response to VIN1 exceeding a threshold and the current I_s1 (e.g., the current through the fuse 104 and signal conductor 105) being high enough to blow the fuse. However, if the source current Is not high enough to blow the fuse 104 when VIN1 exceeds the threshold, the EOS control circuit 106 turns "on" the clamp-FET into the linear region of operation. While in the linear region of operation, the clamp-FET reduces the magnitude of VIN1 to (RDSON*I_s1) (where RDSON is the drain-to-source resistance of the clamp-FET while operating in the linear region). With VIN1 being reduced, power dissipation in die 101 is reduced to a safe level. For example, prior to the EOS control circuit 106 operating the clamp-FET in the linear region, the power dissipation of die 101 is (VIN1*I_s1), but with the clamp-FET operating in the linear region, the die's power dissipation is (RDSON*(I_s1)$^2$) which is a lower value than (VIN1*I_s1).

Die 102 (explained further below) also includes a meandering, self-heating fuse 124 (an example of which also is illustrated in FIG. 7) coupled between VS2 and the RX 120. The RX 120 includes an electro-static discharge (ESD) circuit 128, a receive transistor (RX-FET), and an EOS control circuit 126. In the examples described herein, EOS control circuit 126 may be implemented differently than the EOS control circuit 106.

VS1 is nominally at a low enough level so as not to damage the transmitter 100 of die 101 while providing sufficient operating voltage for the circuitry of the die 101. However, due to an EOS event, the magnitude of VS1 may increase above a safe operating level of the isolator 100. As explained below, the EOS control circuit 106 detects the EOS event and turns "on" the clamp-FET in response to the EOS event.

Figure 2:
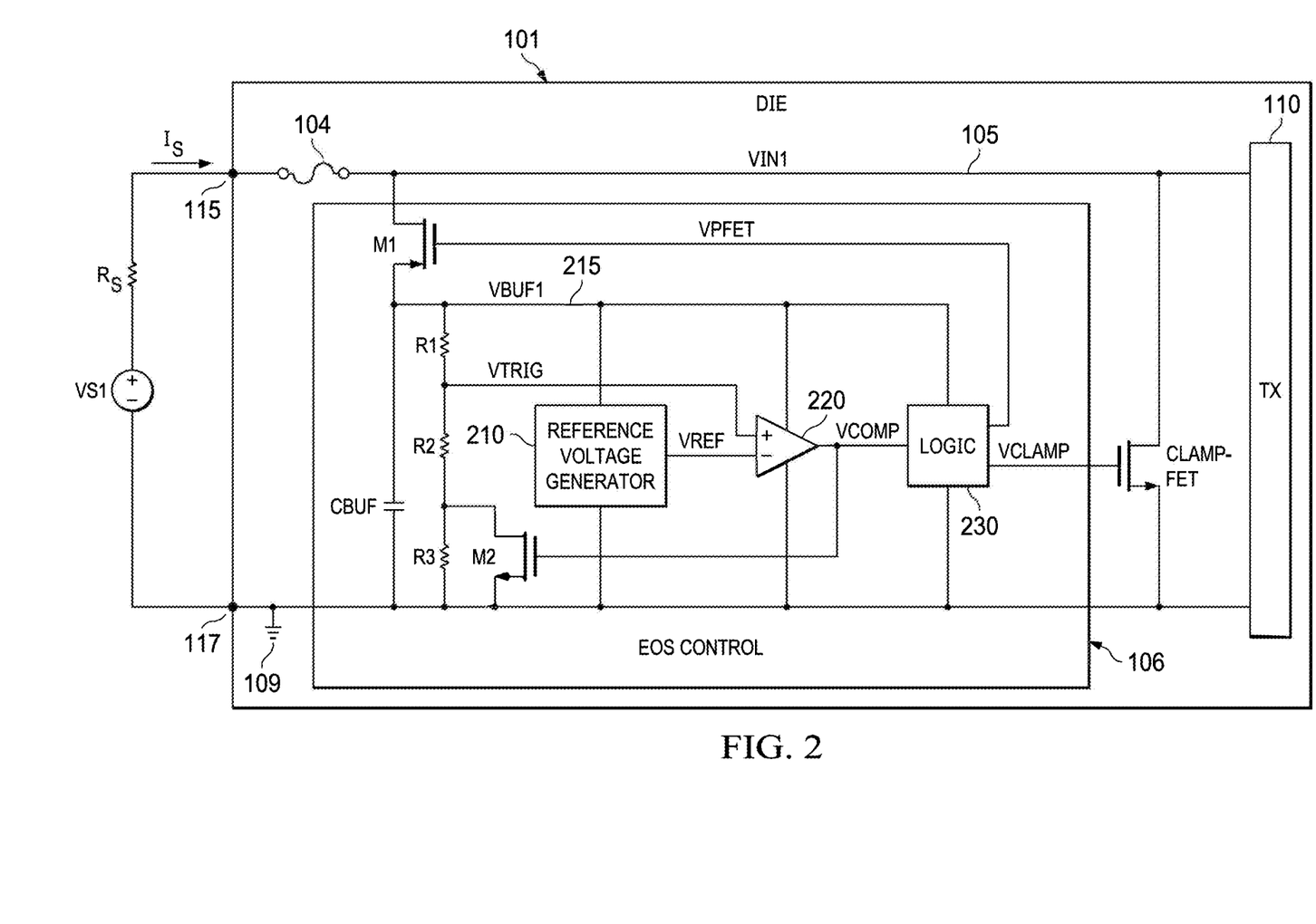
FIG. 2 is a schematic of a gate driver for use in at least one of the dies of FIG. 1 in accordance with an example.

FIG. 2 shows a more detailed schematic of the EOS control circuit 106 of die 101. EOS control circuit 106 in this example includes transistors M1 and M2, a capacitor CBUF, resistors R1, R2, and R3, a reference voltage generator 210, a comparator 220, and logic circuit 230. The TX 110 may include signal conditioning circuitry such as filters, buffers, etc.

In this example, M1 is implemented using a p-channel MOSFET (PFET) and M2 is implemented using an NFET. The drain of M1 is coupled to the conductor 105. The capacitor CBUF is coupled between the source of M1 and ground 109. Logic circuit 230 provides a voltage labeled VPFET to the gate of M1. The logic 230 can turn M1 "on" by asserting VPFET to a voltage level that is at least the threshold voltage (Vt) of M1 below its source voltage. The logic circuit 230 can turn M1 off by forcing VPFET (relative to the source voltage) to a level that is within M1's Vt of its source voltage. When "on", M1 provides a current path from conductor 105 to a plate of capacitor CBUF to thereby charge CBUF. The voltage across CBUF is VBUF1 215. VBUF1 215 functions as an intermediate voltage supply rail for the reference voltage generator 210, the comparator 220, and logic circuit 230. Accordingly, the reference voltage generator 210, the comparator 220, and logic 230 turn "on" and operate (as explained below) when VBUF1 is large enough to power those circuits.

Resistors R1-R3 are coupled in series to function as a voltage divider between VBUF1 215 and ground. The connection point between resistors R1 and R2 provides a voltage labeled VTRIG to the positive/non-inverting/"+" input of comparator 220. When M2 is on, M2 shorts resistor R3 which thereby causes a decrease in the magnitude of VTRIG to the comparator 220.

Reference voltage generator 210 produces a fixed output reference voltage VREF to the negative/inverting/"−" input of comparator 220. The output of comparator 220 is coupled to an input of logic circuit 230. The signal on the output of comparator 220 is labeled VCOMP. When the comparator 220 is "on" (e.g., VBUF1 215 is large enough to turn on the comparator), the comparator 220 asserts VCOMP to a logic "high" level (e.g., around a value of VBUF1 215) responsive to VTRIG being greater than VREF. Otherwise, the comparator 220 forces VCOMP to a logic "low" level (e.g., around a value of ground 109) responsive to VTRIG being lower than VREF. In addition to VCOMP being provided to logic circuit 230, VCOMP is also coupled to the gate of M2 (possibly via a gate driver, not shown). Responsive to VTRIG being greater than VREF, VCOMP is asserted "high" thereby turning "on" M2 and shorting R3.

Logic circuit 230 generates output signal VPFET to turn "on"/"off" M1 and output signal VCLAMP, which is applied to the gate of the Clamp-FET. Gate drivers (not shown) may be included to generate suitable gate voltages for M1 and the Clamp-FET in response to the signals VPFET and VCLAMP, respectively. Accordingly, the logic circuit 230 can independently turn on and off both M1 and the Clamp-FET.

VIN1 is equal in magnitude to VS1 less the voltage drop across Rs. Due to the voltage divider formed by R1-R3, the VTRIG voltage is a scaled-down version of VBUF1 and VIN1, and thus is a proxy for VBUF1 and VIN1. The EOS control circuit 106 responds to VTRIG exceeding VREF (an EOS event) in one of two ways depending on the magnitude of I_s1.

If the magnitude of current I_s1 is high enough to cause the fuse 104 to blow (e.g., caused to be very highly resistive or non-conducting), the EOS control circuit 106 responds as follows. During normal operation (e.g., no EOS event), logic circuit 230 maintains M1 turned "on" (e.g., conducting) by asserting VPFET low enough to turn "on" M1, and the logic circuit 230 maintains the clamp-FET "off" by forcing VCLAMP to be at a sufficiently low level to turn the clamp-FET "off". With M1 "on", VBUF1 is approximately equal to VIN1 (assuming the drain-to-source voltage, Vds, of M1 is fairly small). The resistances of R1-R3 are selected such that, during normal operation, the magnitude of VTRIG is less than the magnitude of VREF. During an EOS event, VIN1 increases which also results in an increase of VBUF1 and thus an increase of VTRIG as well. Once the magnitude of VTRIG exceeds the magnitude of VREF, the comparator 220 asserts VCOMP "high" to the logic circuit 230. The logic circuit 230 responds to the assertion of VCOMP to a "high" by causing the magnitude of VPFET to be high enough to turn "off" the PFET transistor M1 and causing the magnitude of VCLAMP to be high enough to turn "on" the NFET clamp-FET. The reason for turning "off" M1 is explained below.

The clamp-FET provides a current path for I_s1 to flow. If I_s1 is greater than the trip current level for the fuse 104, I_s1 will also be large enough to cause the clamp-FET to operate in the saturation region. The trip current threshold (e.g., 600 mA) for fuse 104 is approximately equal to the current through the clamp-FET when the clamp-FET is in saturation for the gate-to-source voltage (VCLAMP) produced by logic 230. The fuse 104 takes a finite amount of time to blow once I_s1 exceeds the trip current level for the fuse. During that time period, the relatively high level of Is mostly flows through the clamp-FET operating in saturation rather than through the TX 110. Accordingly, the TX 110 is protected from having a large current flowing through it, which otherwise might cause substantial damage (such as by generating damaging heat). Eventually, the fuse 104 blows thereby preventing any damage to the isolator 100, or components near the isolator 100 (such as components on a common semiconductor substrate or a printed circuit board).

In another type of EOS event, VS1 exceeds a safe operating level for the die 101 but I_s1 is not large enough to cause the fuse 104 to blow. Consequently, if the magnitude of I_s1 is less than the trip current level (e.g., the value of current that causes the fuse to blow) for the fuse, I_s1 is also at a low enough magnitude to cause the clamp-FET to operate in the linear region (e.g., the "ohmic" region of transistor operation). In this scenario, the EOS control circuit 106 responds in the following manner. As described above, due to an increase in VIN1 during an EOS event, VTRIG will become larger than VREF, which causes the comparator 220 to cause VCOMP to become a "high" value. As described above, the logic circuit 230 responds to the "high" assertion of VCOMP by turning "off" M1 and then turning "on" the clamp-FET. Because I_s1 is less than the trip current level in this case, the clamp-FET turns operates in the linear region of operation. Most of I_s1 flows through the clamp-FET rather than through TX 110. With the clamp-FET operating in the linear region, its Vds also will be fairly low. Since the clamp-FET is connected between VIN1 and ground 109, the Vds of the clamp-FET is equal to VIN1. Thus, when operating under these conditions (e.g., with the clamp-FET operating in the linear region), VIN1 drops to a fairly small value which protects the TX 110 and the die 101. Because VIN1 will collapse (reduce) in this scenario, the logic circuit 230 disconnects VBUF2 from VIN1 (turns "off" M1) before turning the clamp-FET "on". With M1 "off" and VIN1 decoupled from CBUF, the charge previously provided to the CBUF is used to power the reference voltage generator 210, comparator 220, and logic circuit 230 and to turn "on" the clamp-FET.

In this scenario (large VS1 but I_s1 below the trip point of fuse 104), the fuse 104 does not blow. The EOS control circuit 106 periodically turns "off" the clamp-FET and determines whether VIN1 is still at a level at which VTRIG is larger than VREF (characteristic of an EOS event).

Figure 3:
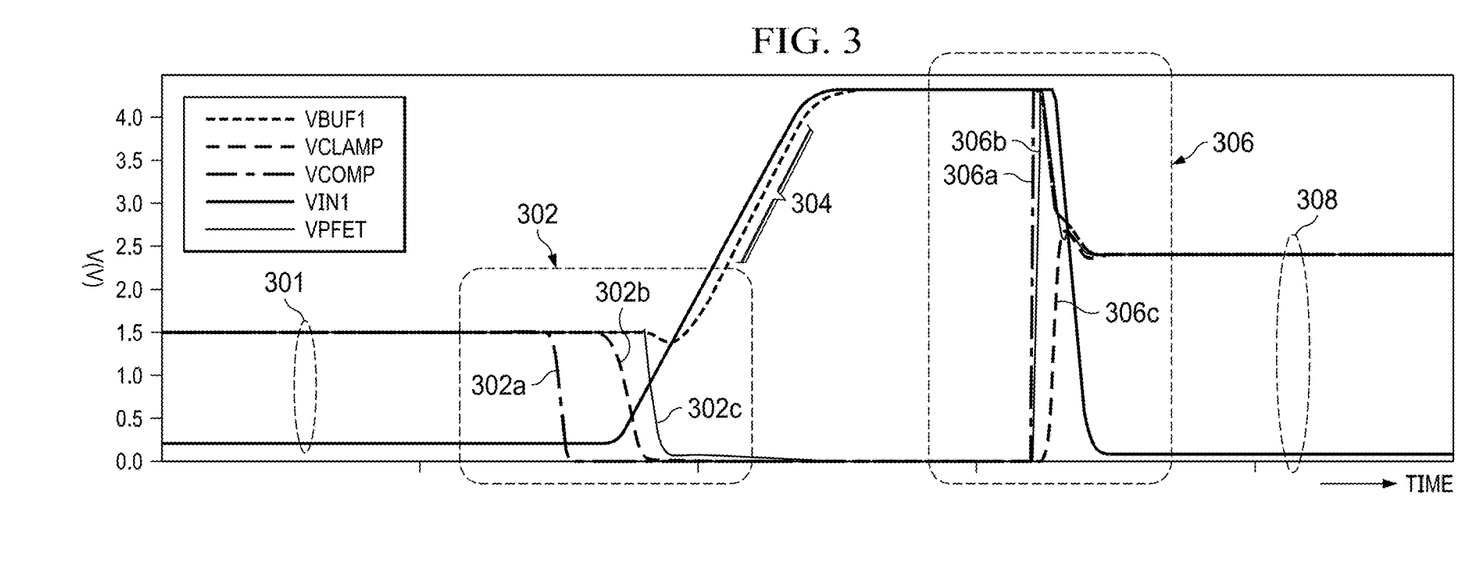
FIG. 3 is a timing diagram of signals shown in FIG. 2 during an electrical overstress event in which the current is not large enough to blow the fuse in accordance with an example.

FIG. 3 is a timing diagram (with the horizontal axis representing time and the vertical axis representing voltage) illustrating a portion of a cycle in which the EOS control circuit 106 determines whether VIN1 still at a high level characteristic of an EOS event. Referring to FIGS. 2 and 3, at 301, VIN1 has collapsed due to the clamp-FET being "on". VCLAMP is at a logic "high" level, which causes the clamp-FET to be "on" and operating in the linear region. The logic circuit 230 has also asserted VPFET "high" to turn "off" the PFET transistor M1 so that the VBUF1 remains high enough (due to previously stored charge on CBUF) to power the reference voltage generator 210, comparator 220, and logic circuit 230 and to turn on the clamp-FET. Responsive to the comparator 220 having previously asserted VCOMP high, the logic circuit 230 responded by first turning off M1 and then shortly thereafter turning on the clamp-FET.

In FIG. 3, although VBUF1 appears to be relatively flat at 301, VBUF1 is actually slowly decaying in accordance with an RC time constant formed by the capacitance of CBUF and the resistance of the series resistance of R1, R2, and R3. That is, when the logic circuit 230 turns "off" M1, the VBUF1 node decays (e.g., the voltage at this node decreases in magnitude) at least partially based on the RC time constant formed by the capacitance of CBUF and the resistance of voltage divider resistors.

Reference numeral 302 depicts the signal transitions of VCOMP (302a), VCLAMP (302b) and PFET (302c). As VBUF1 decays, VTRIG also decays. Upon VTRIG falling below VREF, the comparator 220 forces VCOMP low as shown at 302a. The logic circuit 230 responds to the low assertion of VCOMP by forcing VCLAMP "low" (302b) to turn off the clamp-FET, and then after the clamp-FET is "off", the logic circuit 230 forces VPFET "low" (302c) to turn "on" M1. With M1 "on", VBUF2 is again coupled to VIN1 and the capacitor CBUF is charged. Assuming the EOS event remains in place, VIN1 increases upon the logic circuit 230 turning "off" the clamp-FET. Reference numeral 304 illustrates that VBUF1 closely approximates VIN1 and both voltages increase due to the continued occurrence of the EOS event.

Reference numeral 306 depicts the signal transitions assuming the EOS event is continuing. Eventually, VBUF1 increases to a point at which the magnitude of VTRIG is again high enough to cause the comparator 220 to force VCOMP "high" (306a). The logic circuit 230 responds to the high assertion of VCOMP by forcing VPFET "high" (306b) followed by forcing VCLAMP "high" (306c), which turns "off" M1 before turning "on" the clamp-FET. The turning "on" of clamp-FET causes VIN1 to be reduced at 306.

At 308, VIN1 has reduced and stabilized at a relatively "low" level as a result of the clamp-FET turning "on" and operating in the linear region. As noted above, VBUF1 decays/reduces (during 306) at a rate that is a function of the RC time constant. Because VCLAMP, VCOMP, and VPFET are derived indirectly from VBUF1, signals VCLAMP, VCOMP, and VPFET also decay at the same rate as VBUF1.

Figure 4:
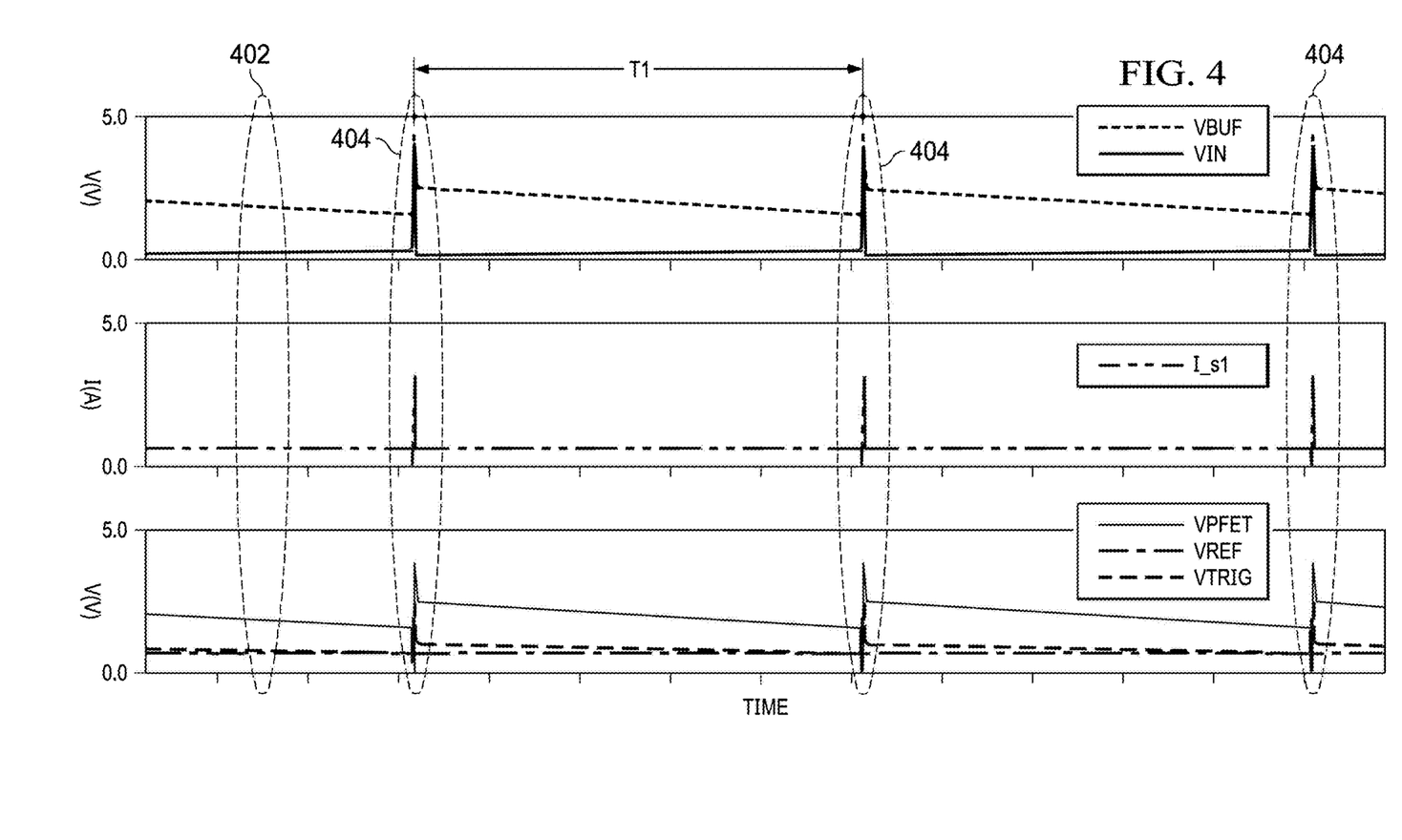
FIG. 4 is another timing diagram of signals shown in FIG. 2 illustrating duty-cycling of the gate driver during an electrical overstress event in which the current is not large enough to blow the fuse in accordance with an example.

During an EOS event in which the magnitude of I_s1 is not large enough to blow the fuse 104, the EOS control circuit 106 periodically performs the sequence depicted in FIG. 3 and discussed above. FIG. 4 includes a horizontal axis that depicts time and a vertical axis that depicts either voltage (for VBUF1, VIN, VPFET, VTRIG and VREF) or current (for I_s1). FIG. 4 illustrates the periodic performance of the sequence depicted in FIG. 3. FIG. 4 shows example waveforms for VBUF, VIN, I_s1, VPFET, VTRIG, and VREF. VREF is a fixed voltage level. At 402, M1 is "off" and the clamp-FET is "on". VBUF1 is sourced by the charge on capacitor CBUF, and, thus, VBUF2 decays as explained above. VPFET and VTRIG also decay. At 402, the magnitude of VIN1 is a relatively low due to the clamp-FET being "on" and operating in the linear region.

Reference numerals 404 are examples of the sequence detailed in FIG. 3 where some voltages and/or current transitions from one magnitude to another. During each such sequence, the logic circuit 230 turns "off" the clamp-FET and turns "on" M1. With M1 being turned "on", VIN1 increases and VBUF1 follows VIN1 as explained above. With the EOS event on-going, VTRIG (which is derived from VBUF1) exceeds (this transition may occur rapidly) VREF, and the comparator 220 responds by asserting VCOMP "high", responsive to which, the logic circuit 230 asserts VPFET "high" (to turn "off" M1) followed by asserting VCLAMP "high" (to turn the clamp-FET "on"). VIN1 again collapses, and VBUF1 decays according to the aforementioned RC time constant until VTRIG again falls below VREF thereby triggering another sequence 404. The time period between sequences 404 is labeled as time period T1. T1 is determined by the RC time constant of the "analog timer" formed by C BUF and the voltage divider. In one example T1 is around 25 microseconds, but can be other than 25 microseconds in other examples.

Referring again to FIG. 2 and as explained above, in response to VTRIG exceeding VREF, the comparator 220 asserts VCOMP "high". Responsive to VCOMP being asserted "high", the logic circuit 230 causes, as discussed above, clamp-FET to turn "on", M1 to turn "off" and M2 to turn "on". The drain and source of M2 are connected to the opposing terminals of resistor R3 as shown. Thus, with M2 "on", resistor R3 is shorted by M2, and the voltage divider effectively only includes the resistance of resistors R1 and R2 (and, possibly, the minimal source-to-drain resistance of M2). With only the resistances of resistors R1 and R2, the voltage level of VTRIG increases. Transistor M2 is used to short R3 to thereby provide hysteresis for the comparator 220.

Figure 5:
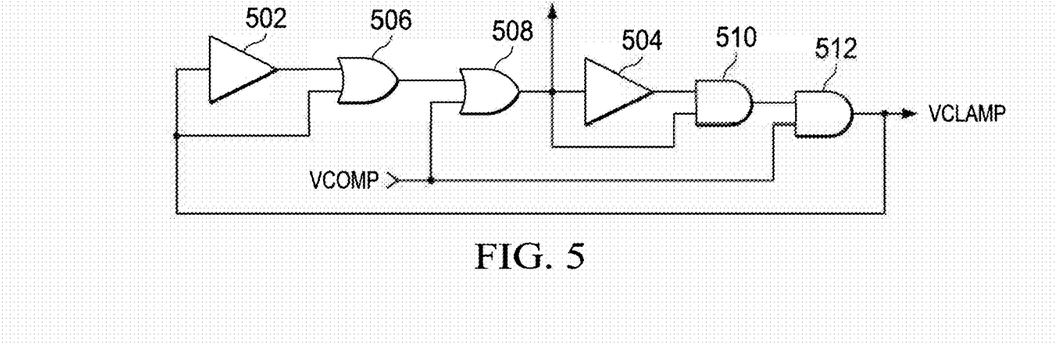
FIG. 5 is a schematic illustrating an implementation of a logic circuit shown in FIG. 2 in accordance with an example.

FIG. 5 is a circuit illustrating an example implementation of the logic circuit 230. The logic circuit 230 in this example includes delay buffers 502 and 504, OR gates 506 and 508, and AND gates 510 and 512. The logic circuit 230 can be implemented with other combinations of delay buffers and logic gates as well. VCOMP is provided to an input of OR gate 508 and AND gate 512. The output of AND gate 512 is VCLAMP. The output of AND gate 512 is also coupled to the input of delay buffer 502 as well as to an input of OR gate 506. The output of delay buffer 502 is coupled to the other input of OR gate 506. The output of OR gate 506 is coupled to an input of OR gate 508. The output of OR gate 508 is VPFET and is also coupled to the input of delay buffer 504 and to an input of AND gate 510. The output of the delay buffer 504 is coupled to an input of AND gate 510. The output of AND gate 510 is coupled to an input of AND gate 512.

In one example, the time delay implemented by delay buffer 502 is the same as the time delay implemented by delay buffer 504. In other examples, the time delays of the delay buffers are different. Each delay buffer may be implemented as a series coupling of multiple (e.g., an even number of) inverters, or the delay buffers may be implemented in any other suitable configuration.

As explained above, when VIN1 increases to the point that VTRIG exceeds VREF, the comparator 220 causes VCOMP to transition from logic "low" (e.g., a voltage having a magnitude at or near ground) to logic "high" (e.g., a voltage having a magnitude at or near VBUF1, which may have a magnitude at or near VIN1 and/or VS1). Responsive to VCOMP being at a logic "high" value, OR gate 508 causes VPFET to become a logic "high" value, which causes M1 to turn "off". The rising edge of VPFET propagates through delay buffer 504 to AND gate 510. The output of AND gate 510 then transitions "high" has well (following a time delay from VCOMP becoming logic "high" largely driven by the delay buffer 504). At this point, both inputs of AND gate 512 are a logic "high" level, thereby causing VCLAMP to become a logic "high" level (thereby turning "on" the clamp-FET). As such, the combination of delay buffer 504, OR gate 508, and AND gates 510 and 512 causes VPFET to become logic "high" followed by (after a time delay) VCLAMP becoming logic "high". This signal sequencing is responsive to the comparator 220 detecting that VIN1 has exceeded a threshold (e.g., VIN's proxy, VTRIG, exceeding VREF) by first decoupling VIN1 from CBUF and then turning "on" the clamp-FET.

At the end of the time period implemented by the analog timer formed by the combination of CBUF and resistors R1-R3 (e.g., 25 microseconds), VTRIG falls below VREF which causes VCOMP to transition from "high" to "low". When VCOMP becomes "low", AND gate 512 forces VCLAMP "low" thereby turning of the clamp-FET. A "low" assertion of VCOMP propagates through delay buffer 502 to an input of OR gate 506. The output signal from OR gate 502 transitions from "high" to "low" after a delay time period (implemented by delay buffer 502) following the "high" to "low" assertion of VCLAMP. The "low" assertion of the output signal from OR gate 506 then propagates through OR gate 508 (VCOMP is already logic "low") to cause VPFET to transition from "high" to "low". This signal sequencing responds to the comparator 220 detecting that VIN1 has fallen below a threshold (VIN1's proxy VTRIG becoming smaller than VREF) by first turning "off" the clamp-FET and then turning "on" M1 to again charge capacitor CBUF.

Figure 6:
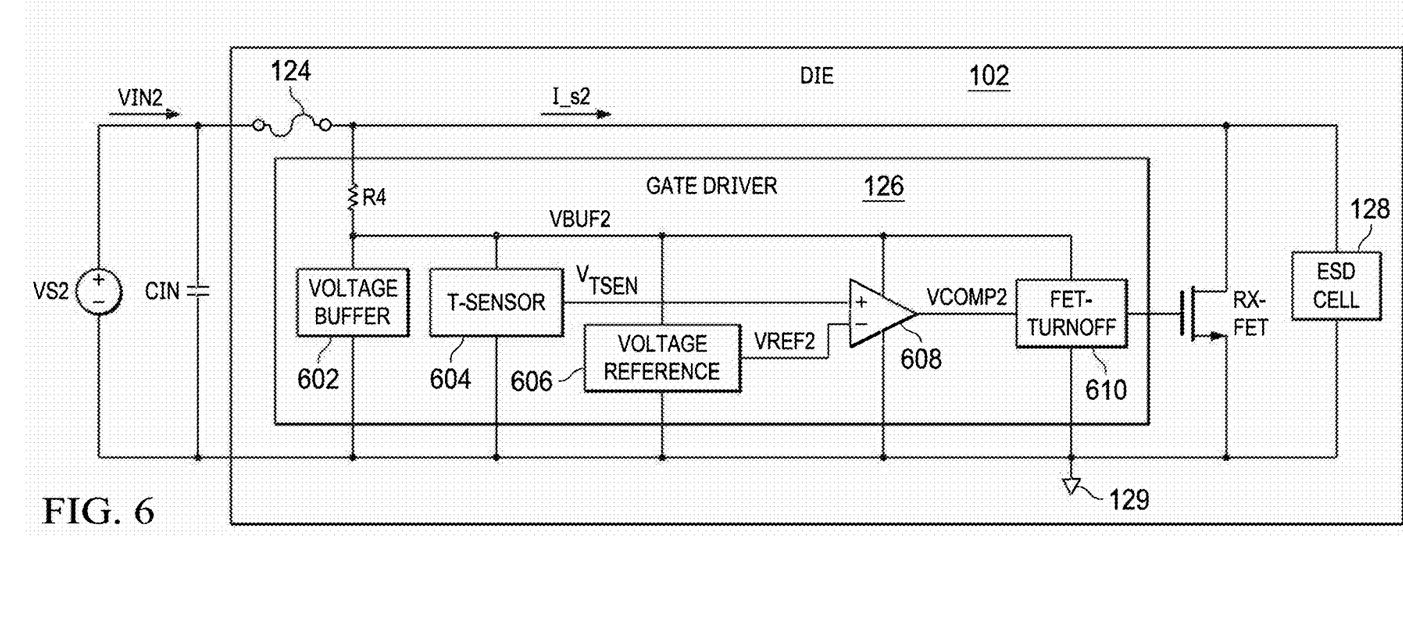
FIG. 6 is a schematic of a gate driver for use in the other of the dies of FIG. 1 in accordance with an example.

FIG. 6 is a schematic diagram illustrating an example implementation of the EOS control circuit 126 for die 102 which includes the fuse 124, RX-FET and the ESD circuit 128. As explained above, the EOS protection on die 101 is voltage-based and implements duty-cycling when the current I_s1 is not large enough to blow fuse 104. As described below, however, for die 102 the EOS protection is temperature-based.

The EOS control circuit 126 for die 102 includes a resistor R4, a voltage buffer 602, a temperature sensor 604, a voltage reference circuit 606, a comparator 608, and a FET turnoff circuit 610. The voltage buffer 602 includes a capacitor charged through R4 to provide an intermediate supply rail (VBUF2) to operate the temperature sensor 604, the voltage reference circuit 606, the comparator 608, and the FET turnoff circuit 610. The voltage reference circuit 606 generates a voltage VREF2 that is substantially independent of temperature. The temperature sensor 604 may be implemented, for example, as a thermocouple or any type of component that has a known/calibrated temperature coefficient (e.g., base-to-emitter voltage of a BJT, threshold voltage of a MOSFET, etc.). In one implementation, the output signal Vtsen from the temperature sensor 604 is a voltage that is proportional to temperature. The positive/non-inverting/"+" input of the comparator 608 is coupled to the temperature sensor 604 and receives Vtsen. The negative/inverting/"−" input of the comparator is coupled to the voltage reference circuit 606 and receives VREF2. The RX-FET is "on" during normal (non-EOS) operation. The transistor RX-FET is not necessarily coupled between the power supply and ground. Instead, the RX-FET is representative of a switch in, for example, a half-bridge and/or RX-FET may include more than one transistors.

During an EOS event in which VIN2 exceeds the trip point of the ESD circuit 128, the ESD circuit 128 provides a low impedance path to ground. If current I_s2 exceeds the trip point for the fuse 124, the fuse 124 blows thereby shutting "off" current through the receiver.

However, if current I_s2 is not large enough to blow the fuse, the power dissipated by die 102 will still be relatively large and the die's temperature will increase. Upon the temperature signal Vtsen exceeding VREF2, the comparator 608 asserts its output signal VCOMP2 "high". The comparator 608 asserts VCOMP2 to a logic "high" state. The FET turnoff circuit 610 responds to a "high" assertion of VCOMP2 by turning "off" the RX-FET. The FET turnoff circuit 610 produces a suitable voltage to turn "on" or "off" the RX-FET based on VCOMP2. If the EOS event subsides, the temperature will decrease and eventually Vtsen will fall below VREF2. The comparator 608 responds by forcing VCOMP2 "low" and the FET turnoff circuit 610 responds to a "low" assertion of VCOMP2 by turning "on" the RX-FET.

In the aforementioned embodiment, the temperature signal Vtsen is provided to the comparator's positive input and VREF2 is provided to the negative input of the comparator. As such, VCOMP2 is asserted "high" responsive to an over-temperature condition. Alternatively, the temperature signal Vtsen can be provided to the comparator's negative input and VREF2 can be provided to the comparator's positive input. In this alternative embodiment, VCOMP2 is asserted "low" responsive to an over-temperature condition, and the FET turnoff circuit 610 responds to a "low" assertion of VCOMP2 by turning "off" the RX-FET.

In the above embodiment, the transmitter side of the isolator 100 implements the EOS control circuit 106 and clamp-FET while the receiver side of the isolator includes the EOS control circuit 126 to control the RX-FET in response to an over-temperature condition. In another embodiment, the receiver side of the isolator 100 can implement the EOS control circuit 106 and clamp-FET while the transmitter side of the isolator includes the EOS control circuit 126 and RX-FET. Further still, both sides of the isolator can implement both temperature and over-voltage/over-current protection. The example of FIG. 1 includes circuitry to protect the power inputs to the TX 110 and the RX 120 from EOS events. However, the same circuitry (EOS control circuits 106 and 126 and their respective transistors) can be implemented instead or additionally on the data signal inputs and outputs (IN and OUT).

Although embodiments of the safety mechanisms are illustrated in the figures in the context of a transmitter-receiver with an isolation barrier therebetween, each type of safety mechanism can be implemented in other types of systems. For example, the EOS control circuit 106 and clamp-FET and/or the EOS control circuit 126 can be provided for one or more input/output pins of any type of IC.

FIG. 7 is a top-down view of an example implementation of a self-heating meandering fuse 700 that can be used to implement either or both of fuses 104 and 124. The fuse 700 includes a conductive element 706 that meanders (serpentines) between two contact pads 702 and 704. In this example, the conductive element includes three generally parallel segments 711, 712, and 713 joined by generally U-shaped corners 715 and 716 as shown. Segment 712 is an inner segment and is sandwiched between outer segments 711 and 713. The U-shaped corners may be rounded, squared, or a combination of round and square (as shown in FIG. 7). The conductive element 702 706 may comprise any suitable metal such as, for example, aluminum, copper, gold, silicon chromium, and/or a polymer or mixture of the above and/or any suitable material used to construct resistors.

The widths of outer segments 711 and 713 are approximately the same and designated as D1. The width of inner segment 712 is designated D2. The gap between the inner segment 712 and the outer segments 711 and 713 is D3, and D4 is the length of the inner segment. In one embodiment, the dimensions of D1, D2, and D3 are different as between fuses 104 and 124, although in other embodiments, fuses 104 and 124 are sized the same (D1 is the same for fuses 104 and 124, D2 is the same for the fuses, and D3 is also the same). In one particular example, D1 for fuse 104 is approximately 12 microns, D2 is approximately 9 micrometers (microns), D3 is approximately 2 microns, and D4 is approximately 18 microns, while D1, D2, D3, and D4 for fuse 124 are approximately 20 microns, 18 microns, 4 microns, and 10 microns, respectively.

The current (e.g., Is) that flows through the fuse 700 flows, for example, from contact pad 702, through outer segment 713, through inner segment 712, and through the opposing outer segment 711 to contact pad 704. Each segment 711-713 generates heat as current flows through it. Because the inner segment 712 is sandwiched between the two outer segments 711 and 713, not only does inner segment 712 generate heat on its own due to the current therethrough, but a portion of the heat generated by the outer two segments 711 and 713 also further increases the temperature of the inner segment 712. The inner segment thus experiences a greater degree of thermal load than the outer segments 711 and 713, and thus the inner segment will break (e.g., melt or "blow") before the outer two segments would otherwise break. The outer segments 711 and 713 thus form side heaters for the inner segment 712.

Due to the additional heating provided by the side heaters (outer segments 711 and 713), fuse 700 will generally blow at a lower current level than if the fuse was just a single (non-meandering) conductive element with no side heaters (all else being equal in terms of conductive element thickness and length and material). An advantage of using a self-heating, meandering fuse 700 for fuse 104 is that the clamp-FET need not have as much current flowing through it before the fuse blows. Accordingly, the size of the clamp-FET can be smaller than otherwise would be the case if a self-heating, non-meandering fuse having a higher current trip point was used for fuse 104.

As used herein, the terms "decay" and "collapse" (when used with reference to a voltage) means to reduce, either slowly or rapidly. Additionally, references to operating in the "linear regions" may refer to a transistor operating in the linear or ohmic region of the transistors curves, and operation in the "saturation" regions may refer to a transistor operating in the saturation region of the transistor curves.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a metal-oxide-silicon FET ("MOSFET") (such as an n-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value. Modifications are possible in the described examples, and other examples are possible within the scope of the claims.

Modifications are possible in the described embodiments, and other embodiments are possible, within the scope of the claims.

What is claimed is:

1. An integrated circuit (IC), comprising:
a fuse having a first fuse terminal and a second fuse terminal, the first fuse terminal coupled to a first IC terminal;
a first transistor having a control input and first and second current terminals, the first current terminal coupled to the second fuse terminal, and the second current terminal coupled to a second IC terminal;
a comparator having a comparator output, the comparator configured to compare a reference voltage to a second voltage based on the first voltage; and
a logic circuit having a first logic circuit input and a first logic circuit output, the comparator output coupled to the first logic circuit input, and the logic circuit is configured to operate the first transistor in a linear region or a saturation region responsive to a first voltage at the second fuse terminal and a first current at the first current terminal.

2. The IC of claim 1, in which the fuse is configured to have a trip current level, and responsive to a current through the fuse exceeding the trip current level, the logic circuit is configured to turn on the first transistor in the saturation region, and current through the fuse causes the fuse to blow.

3. The IC of claim 2, in which responsive to the current through the fuse being below the trip current level, the logic circuit is configured to turn on the first transistor into the linear region and a voltage difference between the first transistor's first and second current terminals reducing the first voltage.

4. The IC of claim 1, in which the logic circuit has a second control output, and the IC further includes:
a second transistor having a second control input and third and fourth current terminals, the third current terminal coupled to the second fuse terminal, and the second control input coupled to the second control output;
a capacitor coupled between the fourth current terminal and the second IC terminal; and
a voltage divider coupled in parallel with the capacitor, the voltage divider configured to provide the second voltage.

5. The IC of claim 4 further comprising the comparator asserting a comparator output signal to a first logic state responsive to the second voltage exceeding the reference voltage, and responsive to the comparator asserting the comparator output signal to the first logic state, the logic circuit is configured to assert a second control signal on a second logic circuit output to turn off the second transistor.

6. The IC of claim 5, in which the logic circuit includes at least one delay buffer which causes the logic circuit to turn off the second transistor before turning on the first transistor.

7. The IC of claim 1, in which the first and second IC terminals are power supply terminals.

8. The IC of claim 1, in which the fuse has a serpentine conductive element between the first and second fuse terminals.

9. The IC of claim 8, in which the serpentine conductive element has generally parallel first, second, and third conductive elements, the first conductive element disposed between the second and third conductive element, and, in response to current flowing through the first, second, and third conductive element, heat generated by the second and third conductive elements elevates a temperature of the first conductive element.

10. The IC of claim 1, in which the comparator is a first comparator, and the IC further includes:
a second transistor having a second transistor control input;
a temperature sensor;
a second comparator configured to assert a second comparator output signal to a first logic state in response to a temperature signal from the temperature sensor being greater than a second threshold voltage; and
a transistor turn-off circuit configured to generate a voltage on the second transistor control input to turn off the second transistor responsive to the second comparator output signal being in the first logic state.

11. A device, comprising:
a fuse having a first fuse terminal and a second fuse terminal, the first fuse terminal coupled to a first device terminal and the second fuse terminal configured to have a first voltage;
a first transistor having a first control input and first and second current terminals, the first current terminal coupled to the second fuse terminal and the second current terminal coupled to the second device terminal; and
a control circuit coupled to the first transistor and configured to:
control the first transistor to operate in a saturation region in response to the first voltage exceeding a threshold and a current through the fuse exceeding a trip threshold current of the fuse; and
control the first transistor to operate in a linear region in response to the first voltage exceeding a threshold and a current through the fuse being below the trip threshold current of the fuse.

12. The device of claim 11, wherein the control circuit further including:
a second transistor having a second control input and third and fourth current terminals, the third current terminal coupled to the second fuse terminal;
a logic circuit coupled to the second control input of the second transistor;
a capacitor coupled between the fourth current terminal and the second IG device terminal; and
a voltage divider coupled in parallel with the capacitor.

13. The device of claim 12, in which:
the voltage divider is configured to produce a second voltage derived from the first voltage; and
the logic circuit includes a comparator configured to compare the threshold to the second voltage.

14. The device of claim 13, in which the logic circuit is configured to cause the first transistor to be turned on and the second transistor to be turned off responsive to the comparator determining that the second voltage exceeds the threshold.

15. The device of claim 14, in which the logic circuit includes at least one delay buffer which causes the logic circuit to turn off the second transistor before turning on the first transistor.

16. The device of claim 11, in which the first and second IC terminals are at least one of power supply terminals or input/output terminals.

17. The device of claim 11, in which the fuse is a self-heating fuse having a serpentine conductive element between the first and second fuse terminals.

18. The device of claim 11, in which the device is an isolator device having first and second sides separated by an isolation barrier, and the fuse, the first transistor, and the control circuit are provided in at least one of the sides of the isolator device.

* * * * *